United States Patent
Sugio

(10) Patent No.: US 7,072,206 B2
(45) Date of Patent: Jul. 4, 2006

(54) SEMICONDUCTOR INTEGRATED DEVICE

(75) Inventor: Kenichiro Sugio, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/087,827

(22) Filed: Mar. 24, 2005

(65) Prior Publication Data

US 2005/0162968 A1 Jul. 28, 2005

Related U.S. Application Data

(62) Division of application No. 10/769,818, filed on Feb. 3, 2004, now Pat. No. 6,888,768.

(30) Foreign Application Priority Data

May 29, 2003 (JP) ............................. 2003-151886

(51) Int. Cl.
G11C 11/00 (2006.01)
(52) U.S. Cl. .................. 365/154; 365/156; 365/230.05
(58) Field of Classification Search ................ 365/154, 365/156, 230.05
See application file for complete search history.

(56) References Cited

U.S. PATENT DOCUMENTS

| 5,774,393 A | * | 6/1998 | Kuriyama | ................... 365/156 |
| 5,864,511 A | | 1/1999 | Sato | |
| 2003/0128607 A1 | | 7/2003 | Miyashita et al. | |

FOREIGN PATENT DOCUMENTS

| JP | 11-086561 | 3/1999 |
| JP | 11-353880 | 12/1999 |

* cited by examiner

*Primary Examiner*—Huan Hoang
(74) *Attorney, Agent, or Firm*—VolentineFrancos&Whitt PLLC

(57) ABSTRACT

A semiconductor integrated device includes a memory cell holding bit information; a pair of bit lines connected to the memory cell via which the bit information is input and output in predetermined cycles; and an output section that latches an output from the memory cell via one bit line of the pair and the other bit line and outputs the bit information acquired from the one bit line as a result of reading from the memory cell, and which pre-charges the pair of bit lines before access to the memory cell. The memory cell has a cutoff circuit that cuts off the other bit line to hold voltage thereof produced by pre-charging when the bit information held in the memory cell is read out.

5 Claims, 14 Drawing Sheets

SEMICONDUCTOR INTEGRATED DEVICE

CROSS-REFERENCE TO RELATED APPLICATIONS

This is a divisional of non-provisional U.S. patent application Ser. No. 10/769,818, filed Feb. 3, 2004, now U.S. Pat. No. 6,888,768, which is incorporated herein by reference in its entirety.

BACKGROUND OF THE INVENTION

1. Field of the Invention

The present invention relates to a semiconductor integrated device, and particularly to a memory device called SRAM (Static Random Access Memory).

2. Description of the Related Art

SRAM as a semiconductor integrated device comprises a plurality of memory cells, and each memory cell is connected to a pair of bit lines. Via the pair of bit lines, bit information indicating whether an electric potential exists is written into the memory cell, and bit information held in the memory cell is read out. Such write and read access to the memory cell is performed after applying a potential called pre-charge to the pair of bit lines. The memory cell can be accessed at high speed by having pre-charged. As mentioned above, after having pre-charged, bit information read out from the memory cell is output via an output section. Such semiconductor devices are disclosed in Japanese Patent Laid-Open Publication No. 11-86561 and Japanese Patent Laid-Open Publication No. 11-353880.

In a conventional semiconductor integrated device, for example, when reading out bit information from a memory cell, one bit line transmits bit information indicating a high potential, while the other bit line transmits bit information indicating a low potential. That is, an electric potential is released to discharge electric charges applied to one bit line of the bit line pair pre-charged beforehand. Hence, in the next access to a memory cell, electric charges need to be applied again by pre-charging beforehand.

Because charging and discharging a pair of bit lines is repeated as described above, the reduction of power consumption has been required of semiconductor integrated devices. There is also the problem that the output section operates increasing consumption current, even when writing bit information into the memory cell.

SUMMARY OF THE INVENTION

In view of the above problems, an object of the present invention is to provide a semiconductor integrated device that can reduce consumption current.

The present invention adopts the following configurations in order to solve the above problems.

According to the present invention, there is provided a semiconductor integrated device, comprising:

a memory cell holding bit information; a pair of bit lines connected to the memory cell and used for inputting and outputting the bit information in predetermined cycles; and an output section that latches an output from the memory cell via one bit line of the pair and the other bit line, and outputs the bit information acquired from the one bit line as a result of reading from the memory cell, and pre-charging the pair of bit lines before access to the memory cell, wherein the memory cell has a cutoff circuit that cuts off the other bit line to hold voltage thereof produced by pre-charging when the bit information held in the memory cell is read out.

In the semiconductor integrated device of the present invention, the cutoff circuit is a switch, and the switch can operate based on a switch control signal for switching off in synchronism with the end of pre-charge in writing into the memory cell, and switching on in synchronism with the start of pre-charge in a next writing into the memory cell.

Further, according to the present invention, there is also provided a semiconductor integrated device, comprising:

a memory cell holding bit information; a pair of bit lines connected to the memory cell and used for inputting and outputting the bit information in predetermined cycles; and an output section that outputs the bit information held in the memory cell via the bit line pair to the outside, and pre-charging the bit line pair before access to the memory cell, the semiconductor integrated device further comprising:

a cutoff section that keeps connection between the bit line pair pre-charged to write new bit information into the memory cell and the output section cut off until a next writing.

Moreover, according to the present invention, there is also provided a semiconductor integrated device, comprising:

memory cells holding bit information; and a pair of bit lines connected to the memory cells and used for inputting and outputting the bit information in predetermined cycles, and pre-charging the bit line pair for access to the memory cells, the semiconductor integrated device further comprising:

an equalizer that cuts the bit line pair pre-charged in the former readout in two consecutive cycles of readout for bit information held in the memory cells off from pre-charge potential supply ports and equalizes, in the next readout, respective potentials held in the bit lines of the bit line pair by the cutoff.

Furthermore, according to the present invention, there is provided a semiconductor integrated device, comprising:

memory cells holding bit information; and a pair of bit lines connected to the memory cells via which the bit information is input and output in predetermined cycles, and pre-charging the bit line pair for access to the memory cells, the semiconductor integrated device further comprising:

an equalizer that cuts the bit line pair pre-charged in the former access in two consecutive cycles of access for the memory cells off from pre-charge potential supply ports and equalizes, in the next access, respective potentials held in the bit lines of the bit line pair by the cutoff.

The above and other objects and features of the present invention will become apparent from the following detailed description and the appended claims with reference to the accompanying drawings.

DETAILED DESCRIPTION OF THE PREFERRED EMBODIMENTS

Embodiments of the present invention will be described in detail below with reference to the drawings.

Embodiment 1

Figure 1:
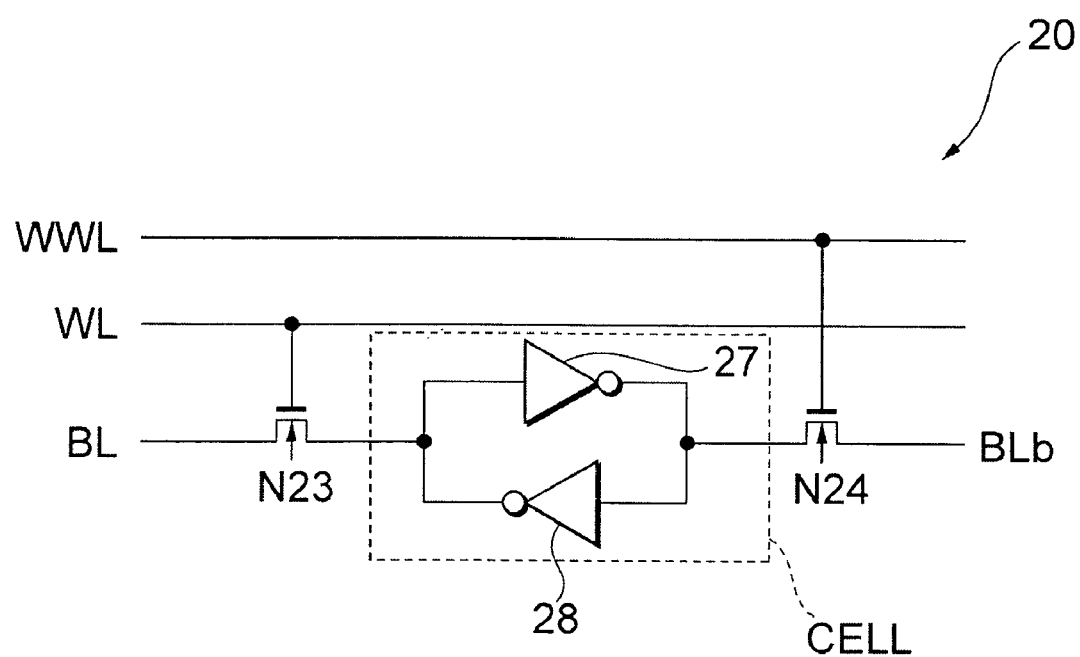
FIG. 1 is a circuit diagram showing a memory cell of embodiment 1.

A semiconductor integrated device 10 of the present invention comprises memory cells 20, and the circuit constituting the memory cell 20 is shown in FIG. 1. The semiconductor integrated device 10 of the present invention is, for example, a memory device such as SRAM for temporarily storing data processed by a digital filter, and the configuration thereof is shown as a circuit function block in FIG. 2.

The semiconductor integrated device 10 of the present invention shown in FIG. 2 comprises a word line decoder section 30 that outputs first word signals (hereinafter, simply called WLs) and second word signals (hereinafter, simply called WWLs) by decoding a plurality of address lines (hereinafter, simply called Ain's) via which an address signal is supplied from a higher level device; a memory array section 40 that selects a desired memory cell from a plurality of memory cells based on the word lines output from the word line decoder section 30 and accesses the selected memory cell to write and read bit information indicating whether a potential exists; a pre-charge control signal generator 50 that receives a pre-charge signal (hereinafter, simply called PRCB_IN) and generates a first pre-charge control signal (hereinafter, simply called PRCB1) and a second pre-charge control signal (hereinafter, simply called PRCB2), which control pre-charge described later to input and output bit information into and from the memory cells of the memory array section 40, and that outputs the signals to the memory array section 40; a write control signal generator 60 that receives a signal indicating the period in which bit information is written into the memory cells 20 (hereinafter, simply called WR_IN) and a signal indicating write permission during the period in which WR_IN enables (hereinafter, simply called WREN), to generate a first write control signal (hereinafter, simply called W) and a second write control signal (hereinafter, simply called WB), which control to write bit information into the memory cells 20, and outputs the signals to the memory array section 40; a select signal generator 70 that generates a first select signal (hereinafter, simply called Y0) and a second select signal (hereinafter, simply called Y1) each for selecting one column from two columns in which the memory cells are arranged and outputs the signals to the memory array section 40; and amplifiers 80 as buffer amplifiers for bit information to be written into the memory cells.

Figure 3:
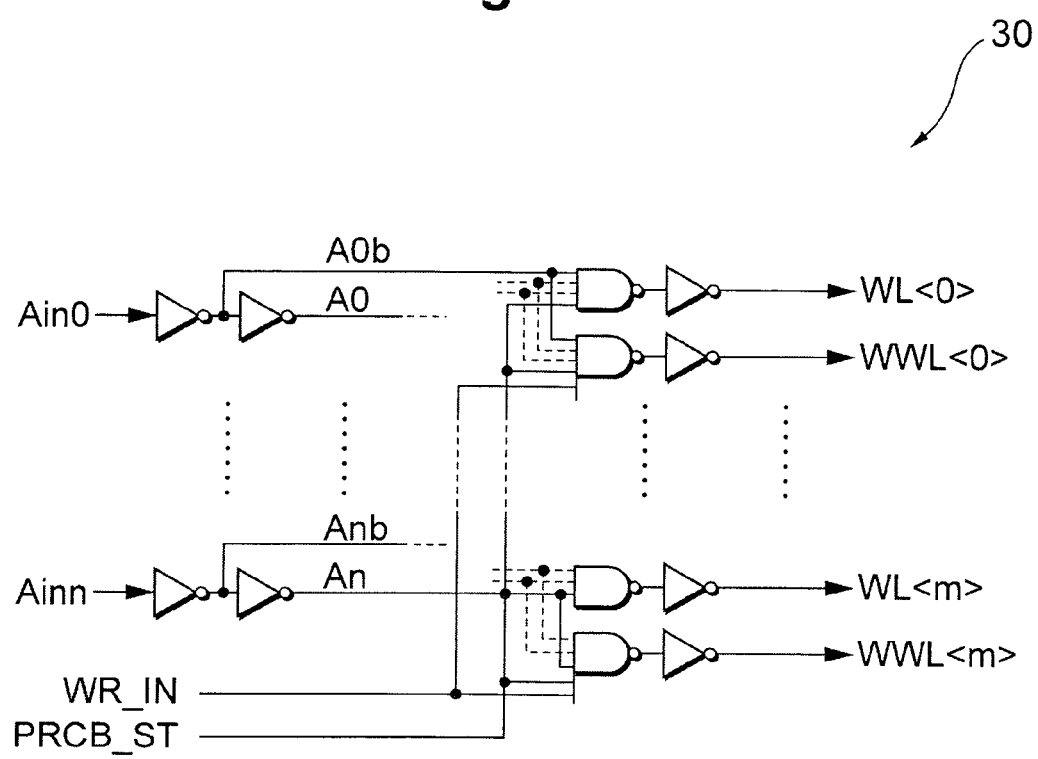
FIG. 3 is a circuit diagram of a word line decoder section.

The word line decoder section 30, as shown in FIG. 3, comprises a plurality of inverters and a plurality of NAND circuits so as to receive the plurality of Ain's (from 0 as the first through n), a signal indicating the start of pre-charge (hereinafter, simply called PRCB_ST), and the WR_IN to output the WLs (from 0 as the first through m) and the WWLs (from 0 as the first through m).

One of the inverters receives Ain 0 to output an inverted signal (hereinafter, simply called A0b) to an NAND circuit. The NAND circuit receives the A0b and also signals via a plurality of address lines and the PRCB_ST in synchronism with the pre-charge signal to perform the logical operation and outputs the result to an inverter. The inverter receiving the logical operation result inverts the result, thereby generating the signal WL0 for accessing desired memory cells from among the plurality of memory cells in synchronism with the pre-charge signal.

The address lines used for generating the WL0 are supplied to another NAND circuit. The NAND circuit receives these address lines and also the PRCB_ST in synchronism with the pre-charge signal and the WR_IN indicating the write period to perform the logical operation and outputs the result to an inverter. The inverter receiving the logical-operation result inverts the result, thereby generating the signal WWL0 to access the same memory cells as the WL0 and indicate the pre-charge period during the write period for the memory cells.

The pre-charge control signal generator 50 comprises a four-stage inverter receiving the PRCB_IN from the higher level device; a NOR circuit receiving a signal diverging from the WB via an inverter and the output from the four-stage inverter; and two inverters making the output from the NOR circuit divide into two and each inverting the output.

Here, the PRCB_IN will be described in detail. The PRCB_IN indicates the period of pre-charge performed before write and read access to memory cells, and one cycle of the PRCB_IN denotes one cycle of access to memory cells. That is, the PRCB_IN unenabling indicates the pre-charge period, and the PRCB_IN enabling indicates the period in which to access memory cells. These two periods form one cycle. Hence, the access to memory cells and the pre-charge never occur at the same time.

The four-stage inverter receiving the PRCB_IN makes the output of its preceding two-stage inverter divide into two, and outputs one of the two as PRCB_ST to the word line decoder section 30 and supplies the other to its following two-stage inverter. The PRCB_ST is a signal obtained by inverting the PRCB IN by the first inverter and further inverting the inverted PRCB_IN by the second inverter, and thus is the same in phase as the PRCB_IN with little delay due to going through the plurality of inverters.

A NOR circuit receives the output signal of the four-stage inverter receiving the PRCB_IN and a signal diverging from the write control signal WB and performs the logical operation. The operation result divides into two, and PRCB1 and PRCB2 are generated respectively from the two via inverters. Because of being each obtained by inverting the diverging signal via the inverter, the PRCB1 and PRCB2 are substantially the same. These PRCB1 and PRCB2 are signals obtained by delaying the PRCB_IN through the plurality of inverters and the like. Hence, the start of the pre-charge lags little because the pre-charge is controlled based on these delayed signals. Thus, while accessing memory cells, the potentials of bit line pairs can be prevented from changing due to the pre-charge.

The write control signal generator 60 comprises a NAND circuit receiving the WR_IN indicating the write period for memory cells when in an enabling state and the WREN indicating write permission during the write period when in the enabling state; an inverter inverting the output of the NAND circuit; and an inverter receiving and inverting one diverging signal of the inverter's output dividing into two, to output the inverted signal as the WB. The other diverging signal is output as W.

Since the WB is a signal generated via the inverter, and the W is output without further going through an inverter, their enabling state and unenabling state are opposite to each other, and the W and WB indicate the write permission period during the write period for memory cells. This permission period lags little behind the WREN due to going through the plurality of inverters.

The select signal generator 70 comprises an inverter receiving an unenable signal Y_IN from the higher level device, and an inverter receiving one diverging signal of the inverter's output dividing into two, to output the inverted signal as Y1.

The Y_IN input to the select signal generator 70 is a signal for selecting one column from a unit of two columns in which a plurality of memory cells are arranged in the memory array section, and memory cells to be accessed exist in the column selected by this signal. That is, the select signal generator 70 generates, based on the Y_IN, the Y0 and Y1 each for selecting one column from the two columns in which memory cells are arranged.

The amplifiers 80 are provided the number of which corresponds to the number of output ports of the higher-level device supplying bit information in parallel. Letting 0 indicate the first output port of the higher-level device, the output ports 0 through x are provided, and accordingly, the amplifiers 80 numbered from 0 as the first through x are provided.

One of the amplifiers 80 amplifies bit information from the first output port of the higher-level device (hereinafter, called D0_IN) and supplies the amplified bit information (hereinafter, called D0) to the memory array section 40, and another of the amplifiers 80 amplifies bit information from the x'th output port (hereinafter, called Dx_IN) and supplies the amplified bit information (hereinafter, called Dx) to the memory array section 40.

The signals generated in the above-mentioned sections 30, 50, 60, 70 and bit information amplified via the amplifiers 80 are supplied to the memory array section 40.

Figure 4:
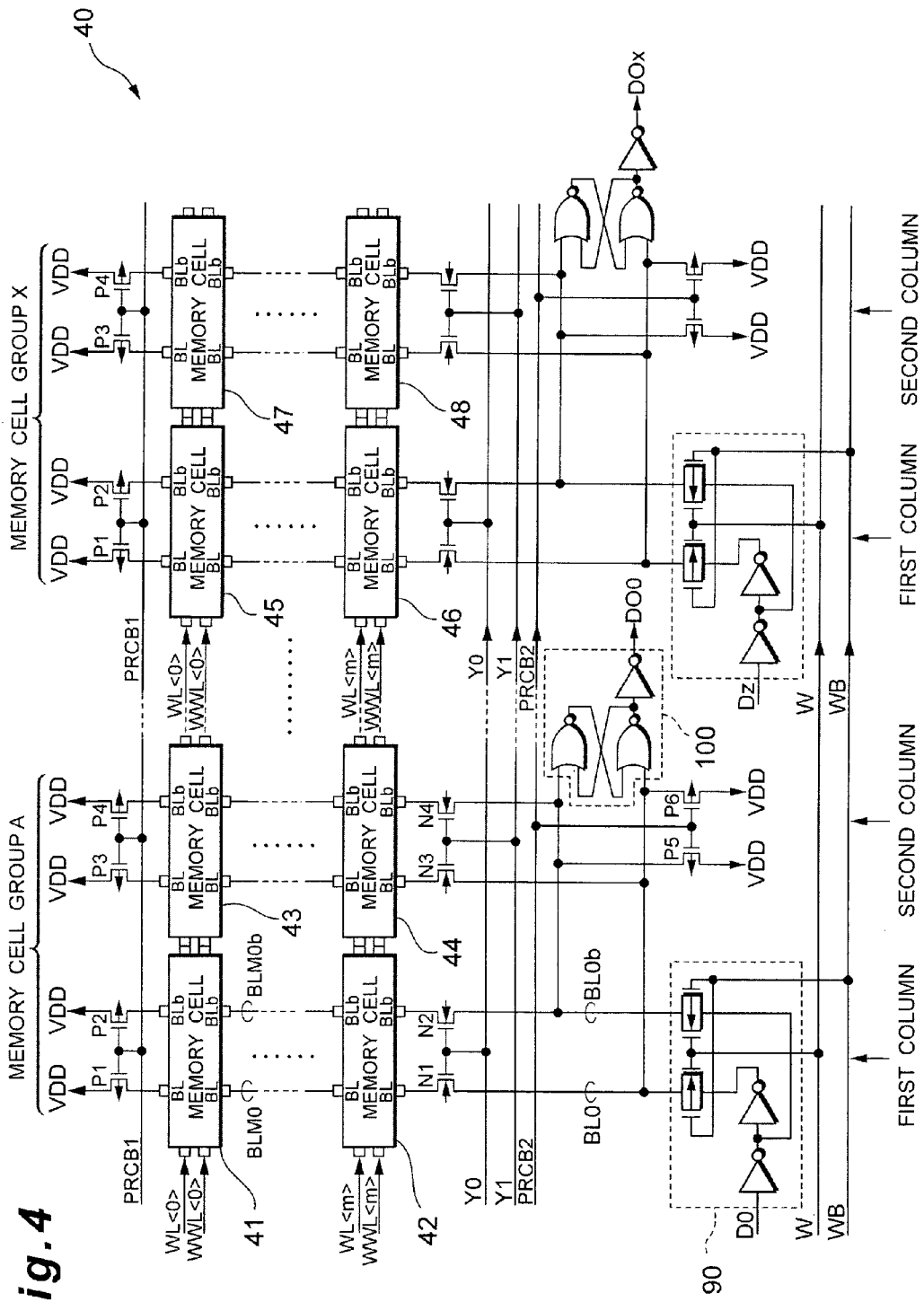
FIG. 4 is a circuit diagram showing a memory array section of the embodiment 1.

Next, the circuit of the memory array section 40 where memory cells are arranged will be described in detail, the circuit diagram of which is shown in FIG. 4.

FIG. 4 shows a memory cell group A as a first memory cell group and a memory cell group X as an x'th memory cell group (the memory cell groups in between the memory cell groups A and X being omitted).

Each memory cell group is a unit of two columns, and one is a first column and the other is a second column. The first column has memory cells respectively receiving the above WL0 through WLm arranged therein (the memory cells in between the WL0 and WLm being omitted in FIG. 4). The memory cells receive the WWL0 through WWLm respectively.

For example, in the first column of the memory cell group A, memory cells 41 and 42 receiving the WWL0 and WWLm respectively are shown and connected by a first bit line (indicated by BLM0) and a second bit line (indicated by BLM0*b*).

The WL0 and WWL0 input to the memory cell 41 are also connected to a memory cell 43 in the same row in the second column of the memory cell group A, and the WLm and WWLm are connected through the memory cell 42 to a memory cell 44 in the same row in the second column of the memory cell group A. This connection in the row direction is also the case with the memory cell group X. For example, a memory cell 45 connected to the WL0 and WWL0 and a memory cell 46 connected to the WLm and WWLm are shown in the first column of the memory cell group X, and a memory cell 47 connected to the WL0 and WWL0 and a memory cell 48 connected to the WLm and WWLm are shown in the second column of the memory cell group X.

The above memory cells have bit line pairs for reading and writing bit information connected thereto. For example, the memory cells 41 and 42 arranged in the first column of the memory cell group A are connected by a bit line pair, and also the memory cells in the second column are connected by a bit line pair likewise, and the memory cells in the memory cell group X are connected by bit line pairs likewise.

One ends of the bit line pairs connected to the memory cells 41, 43, 45, and 47 are connected to a power supply for pre-charging (hereinafter, called VDD), and each bit line is provided with a switch controlled based on the PRCB1.

This switch is of a PMOS type, and a first bit line connected to the memory cell 41 (hereinafter, called BL) is provided with a PMOS as the switch (hereinafter, called P1), and a second bit line (hereinafter, called BLb) is provided with a PMOS as the switch (hereinafter, called P2). Likewise BL for the memory cell 43 is provided with P3, and BLb is provided with P4. Likewise for the memory cells 45, 47 identical switches are provided. Because the structure of the memory cell group X is the same as that of the memory cell group A, a description of the memory cell group X is omitted hereinafter.

VDD potential is applied to the memory cells 42, 44 via the BL, and also VDD potential is applied to the memory cells 42, 44 via the BLb (BL0*b*). The VDD potentials are controlled by switches operating based on the PRCB2. These switches are of the PMOS type. For example, a PMOS (hereafter, called P5) is provided for the BL (BL0) for supplying VDD to the memory cells 42, 44, and a PMOS (hereafter, called P6) is provided for the BLb supplying VDD.

The BL and BLb of the memory cell 42 are provided with switches for selecting the first column based on the Y0. For example, an NMOS (hereafter, called N1) as the switch is provided for the BL of the memory cell 42, and an NMOS (hereafter, called N2) as the switch is provided for the BLb.

The BL and BLb of the memory cell 44 are provided with switches for selecting the memory cells in the second column based on the Y1 opposite to the Y0 in terms of enabling and unenabling. For example, an NMOS (hereafter, called N3) is provided for the BL of the memory cell 44, and an NMOS (hereafter, called N4) is provided for the BLb.

As mentioned above, by providing the switches operating based on the Y0 and Y1 which are in an enabling and unenabling relationship as mentioned above, one of the first and second columns can be selected certainly.

The BL and BLb of the memory cells 42 and 44 are connected to a transfer section 90 for transferring the D0 from the amplifier to the memory cells in the control of the W and WB.

The transfer section 90 comprises an inverter inverting the D0; a first transfer gate as a control switch constituted by a NMOS and a PMOS for transferring the inverted D0 to the BLb; an inverter further inverting the inverted D0 to obtain the same signal as the D0; and a second transfer gate as a control switch constituted by a NMOS and a PMOS for transferring the D0 output from the inverter to the BL.

The NMOSs of the transfer gates are controlled based on the W, and the PMOSs are controlled based on the WB opposite to the W in terms of enabling and unenabling. A known voltage drop due to the threshold voltage of the NMOS can be prevented by the transfer gates constituted by a NMOS and a PMOS.

The BL and BLb of the memory cells 42, 44 are connected to an output section 100 for latching and outputting bit information held by the memory cell.

The output section 100 comprises a first NOR circuit receiving the BL from the memory cells 42, 44; a second NOR circuit receiving one diverging signal of the NOR circuit's operation result dividing into two and the BLb from the memory cells 42, 44 to perform the operation and output the operation result to the first NOR circuit; and an inverter receiving the other diverging signal to output the inversion result as read-out bit information (hereafter, called DO0), and outputs bit information from the BL as the reading-out result as soon as a signal from either of the BL and BLb is latched.

For example when the BL supplies high and the BLb supplies low, the output section. 100 outputs high at the DO0, and when the BL supplies low and the BLb supplies high, the output section 100 outputs low at the DO0. Furthermore, when the BL supplies high and the BLb supplies high, the output section 100 correctly outputs high at the DO0.

The memory cells arranged in the memory array section 40 will be explained with reference to FIG. 1.

The internal configuration of the memory cells 41, 42, 43, 44, 45, 46, and 47 of the memory array section 40 is the same as that of the memory cell 20 shown in FIG. 1.

The memory cell 20 comprises-two inverters 27 and 28, and switches as cutoff circuits, that is, two NMOSs (hereinafter, simply called N23 and N24).

The input of the inverter 27 is connected via the N23 to the BL, and the BL is connected via the N23 to the output of the inverter 28. The output of the inverter 27 is connected via the N24 to the BLb, and the BLb is connected via the N24 to the input of the inverter 28. The gate of the N23 connected to the BL is connected to the WL, and the gate of the N24 connected to the BLb is connected to the WWL.

One of the bit line pair (BL and BLb) becomes enabling while the other becomes unenabling, when accessing the memory cell 20, that is, when reading and writing bit information from and into the memory cell. For example, the BL transmits high while the BLb transmits low.

The WL is a signal of which one cycle consists of enabling and unenabling periods, and is generated correspondingly to the access to memory cells each time.

When the WL is in the enabling state, that is, when accessing the memory cell, the N23 whose gate is connected to the WL becomes ON, thereby releasing the cutoff between the BL and the output of the inverter 28. On the other hand, when the WL is in the unenabling state, the N23 becomes OFF, thereby cutting the BL off from the output of the inverter 28.

The WWL becomes enabling only when writing into the memory cell. When the WWL is in the enabling state, the N24 whose gate is connected to the WWL becomes ON, thereby releasing the cutoff between the BLb and the input of the inverter 28 and the output of the inverter 27. When the WWL is in the unenabling state, the N24 becomes OFF, thereby cutting the BLb off from the input of the inverter 28, and the output of the inverter 27. By cutting the BL off from the one inverter 27 and the BLb off from the other inverter 28, bit information is held in the cell constituted by the one inverter 27 and the other inverter 28.

Figure 5:
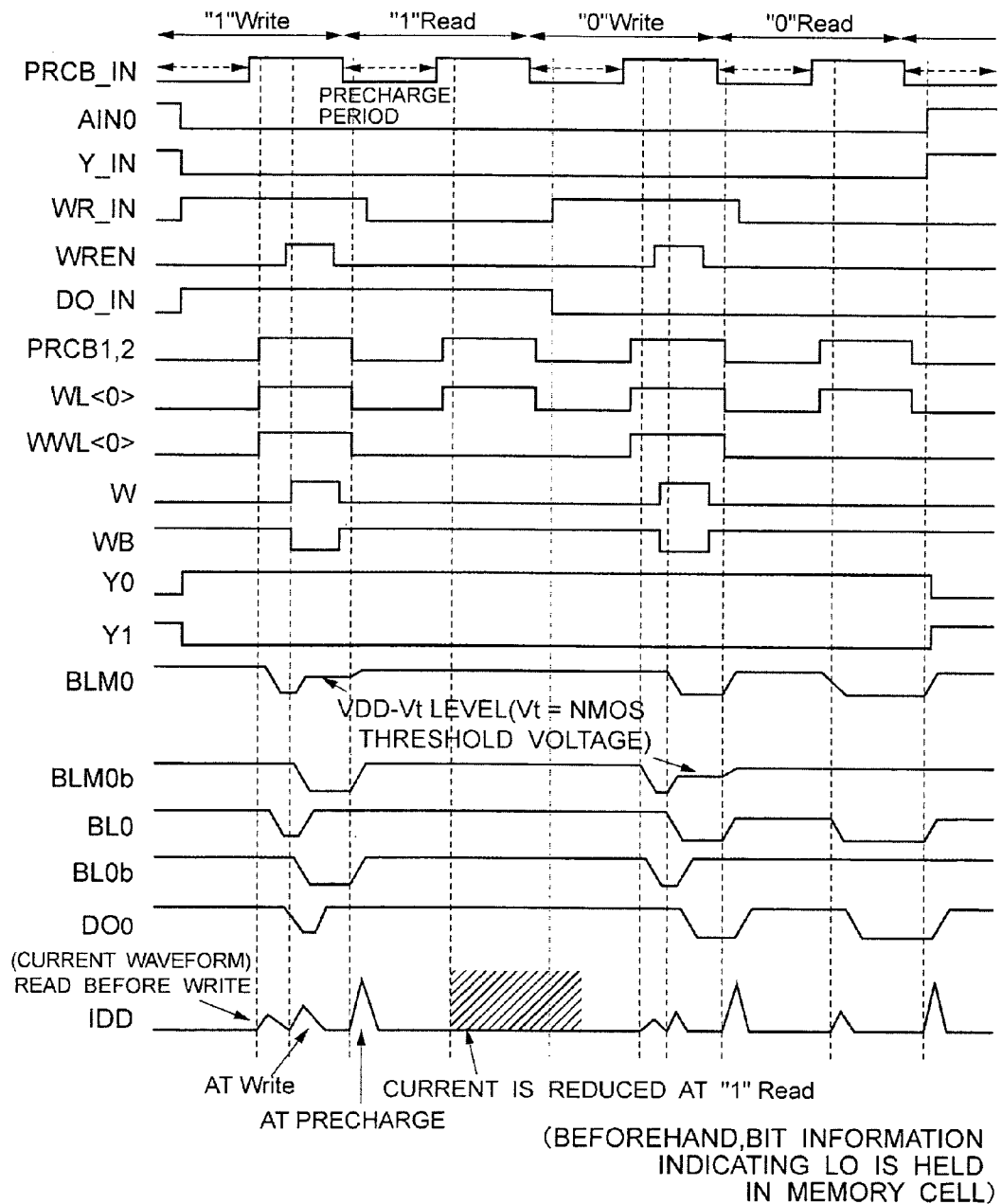
FIG. 5 is a timing chart for the embodiment 1.

The operation of reading out the written bit information after a high potential as bit information is written into the memory cell 20 operating in this way and holding a low potential as bit information will be described with reference to the timing chart of FIG. 5.

Before writing into the memory cell, each bit line (BL and BLb) is pre-charged. At this time, the PRCB_IN gets into an unenabling state, and the pre-charge control signal generator 50 generates the PRCB1 and PRCB2 in the unenabling state. The P1 and P2 shown in FIG. 4 become ON in the control of the PRCB1, and also the P5 and P6 become ON in the control of the PRCB2, thereby supplying VDD to the bit line pairs (BLM0, BLM0b, and BL0, BL0b) for pre-charging.

At this time, the WL and WWL generated by the word line decoder section 30 are in the-unenabling state, and thus the N23 and N24 are OFF in the control of these signals. Thus, the potential applied to the bit line pairs due to the pre-charge is cut off from the cell, so that the bit information held in the cell is not rewritten by the pre-charge.

After the pre-charge, the WL and WWL get into the enabling state, and the bit information held in the memory cell 20 is transmitted to the bit line pair before writing, and thereby the electric current (hereinafter, called IDD) consumed by the semiconductor integrated device of FIG. 5 increases. After that, when the WR_IN and WREN get into the enabling state, the write control signal generator 60 outputs the W in the enabling state and the WB in the unenabling state to the transfer section 90. The transfer section 90 receiving the signals supplies the BL0 with bit information indicating a high potential from the DO obtained by amplifying the DO_IN and supplies the BL0b with bit information indicating a low potential. This supply increases IDD again.

At this time, in the memory cell 20 of FIG. 1, bit information indicating the high potential is supplied to the memory cell 20 via the BL. The N23 of the memory cell 20 becomes ON due to the WL, thereby releasing the cutoff, and thus the high potential is supplied to one side of the cell via the BL.

The bit information indicating the high potential has been lowered by the threshold voltage of the NMOSs (hereinafter, called Vt) by going through the N1 and N2 or the N3 and N4 controlled by the Y0 and Y1 for selecting one of the first and second columns.

Meanwhile, when bit information indicating the low potential is supplied to the memory cell 20 via the BLb, the N24 becomes ON due to the WWL, thereby releasing the cutoff, and thus the low potential is supplied to the other side of the cell via the BLb. Because the low potential is supplied to the other side of the cell, the inverter 28 receiving the signal outputs high, which is the same as the bit information indicating the high potential supplied to the one side of the cell, and by outputting this bit information indicating the high potential via the BL connected to the one side of the cell, the bit information held in the cell can be read out.

When the bit information is held in the cell, the WL and WWL get into the unenabling state in order to perform the pre-charge before reading out, and thereby the memory cell is cut off by the N23 and N24. After that, the bit line pair is pre-charged, thereby increasing IDD.

During the cutoff period, after the BL and BLb are pre-charged, the WL in the enabling state is supplied to the N23. Thus, the N23 becomes ON, so that the bit information indicating the high potential is output via the BL. At this time, the WWL remains in the unenabling state, that is, the BLb is cut off by the N24, the potential produced by the pre-charge before reading out is held on the BLb as it was.

In other words, after the bit information indicating the high potential is written into the memory cell 20 and when reading out this bit information, the high potential is output via the BL on one side and also the high potential is output via the BLb on the other side to the output section 100 of FIG. 4.

The output section 100 receiving both the signals indicating the high potential via the BL and BLb correctly outputs bit information indicating the high potential as the reading result even when receiving the signal being high via the BL and the signal being high via the BLb. Hence, after the bit information indicating the high potential is written into the memory cell 20 and when reading out this bit information, the bit information indicating the high potential held in the memory cell can be correctly read out even without the N24 releasing the cutoff of the BLb, that is, without electrically coupling the BLb to the memory cell. Furthermore, consumption current due to the drop of the potential on the BLb when reading out the bit information can be reduced because the BLb is not electrically coupled to the memory cell.

As described above, the potential on the BLb produced by the pre-charge before reading out is still held because the BLb is not electrically coupled to the memory cell. Accordingly, there is no need for charging the BLb in the pre-charge before the next access to a memory cell ("0" write for bit information indicating the low potential in the timing chart of FIG. 5). Thus, a current for applying the potential is not consumed in the BLb, and thereby the amount of consumption current can be reduced.

As described above, according to the semiconductor integrated device 10 of the embodiment 1, the memory cell connected with the BLb is electrically cut off from the BLb by the WL when reading out the bit information indicating the high potential. Thus, the number of times of charge and discharge can be suppressed, and thereby consumption current can be reduced.

Embodiment 2

Next, a semiconductor integrated device which comprises the memory array section 110 provided with a cutoff section 112 cutting off signals causing unnecessary operation in the output section 100 will be described.

Figure 2:
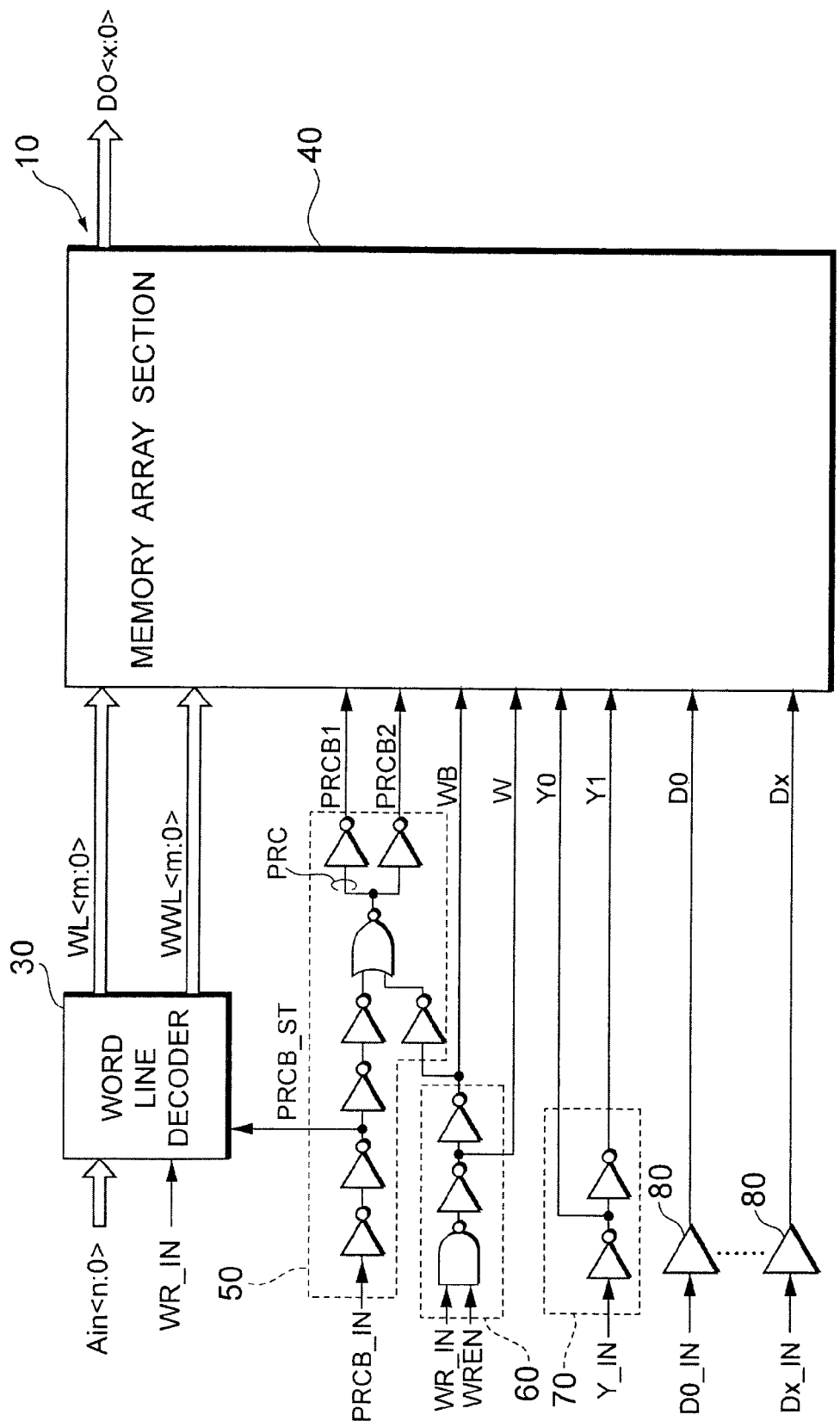
FIG. 2 is a block diagram showing the circuit and function of a semiconductor integrated device of the present invention.

The semiconductor integrated device of the embodiment 2 is the same in configuration as the embodiment 1 shown in FIG. 2, but is provided with a cutoff control signal generator 61 as a new part. In the embodiment 1, the memory array section is controlled using the WB generated by the write control signal generator 60, but in the embodiment 2, the memory array section 110 is controlled using a cutoff control signal (hereinafter, called WS) generated by the cutoff control signal generator 61 instead of the WB.

Figure 9:
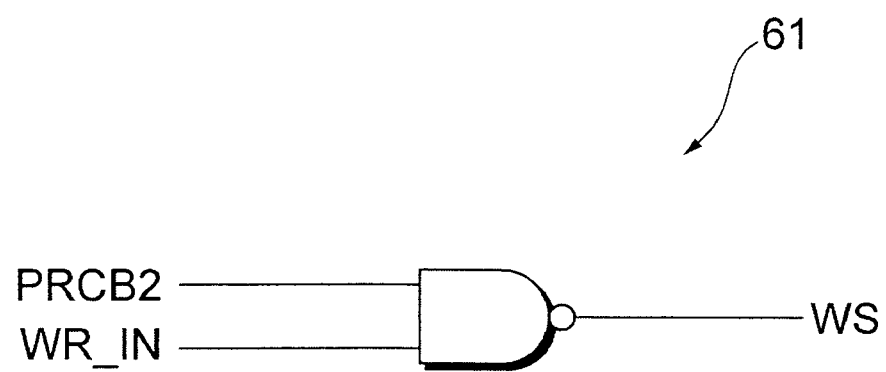
FIG. 9 is a circuit diagram showing a cutoff control signal generator.

The cutoff control signal generator 61 is a NAND circuit as shown in FIG. 9, and receives the PRCB2 controlling the pre-charge and the WR_IN indicating the write period and performs the operation to output the operation result as the WS. Hence, as shown in the timing chart of FIG. 7, the WS is in an unenabling state in synchronism with the pre-charge period but only when writing into memory cells. The cutoff section 112 cuts the bit line pair off based on this signal in an unenabling state.

Figure 6:
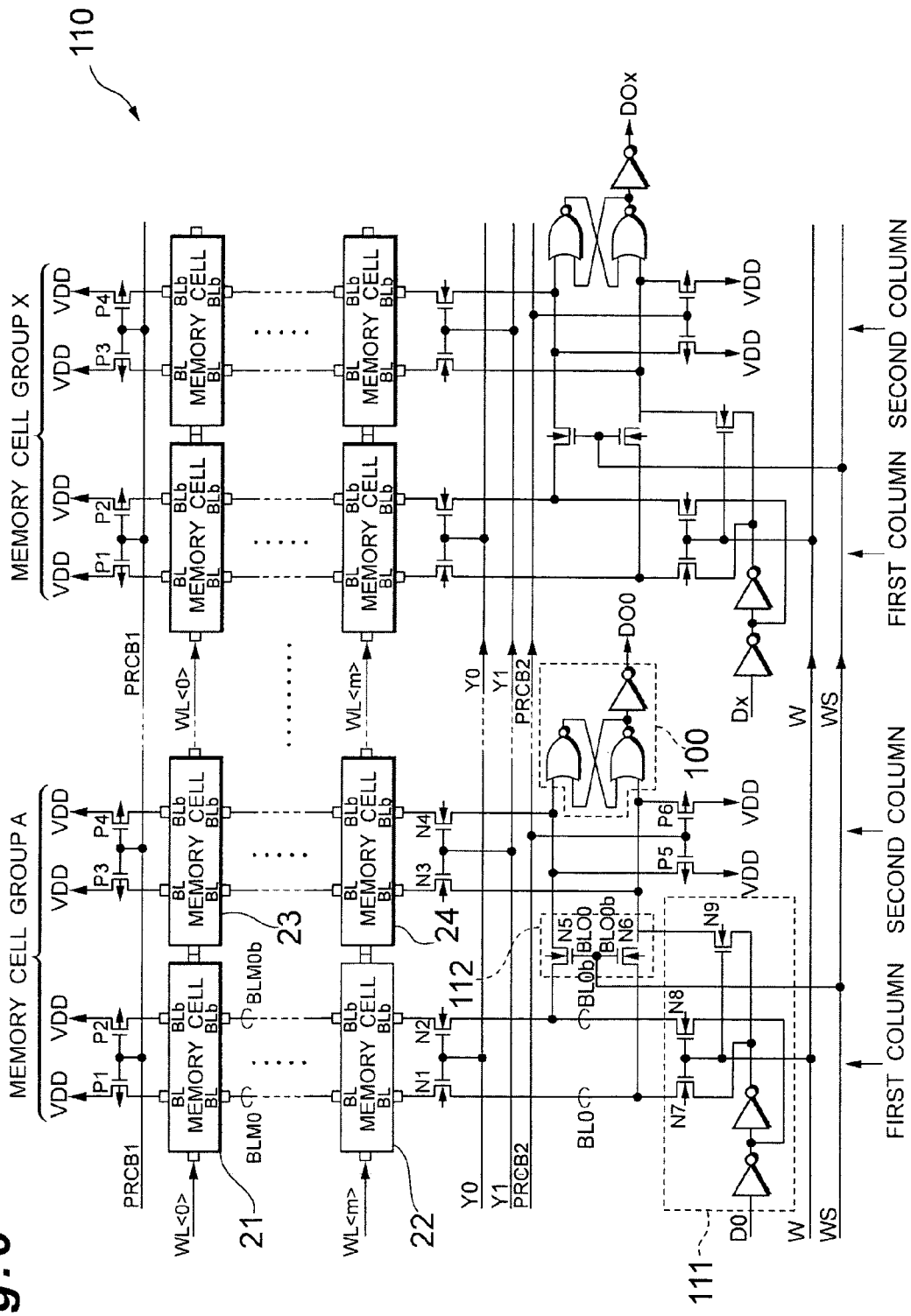
FIG. 6 is a circuit diagram showing a memory array section of embodiment 2.

The memory array section 110 provided with the cutoff section 112 will be described with reference to FIG. 6. The memory array section 110 is constituted by a plurality of memory cell groups as shown in FIG. 6, and the memory cell groups are the same in configuration. Hence, only the memory cell group A will be explained.

Figure 8:
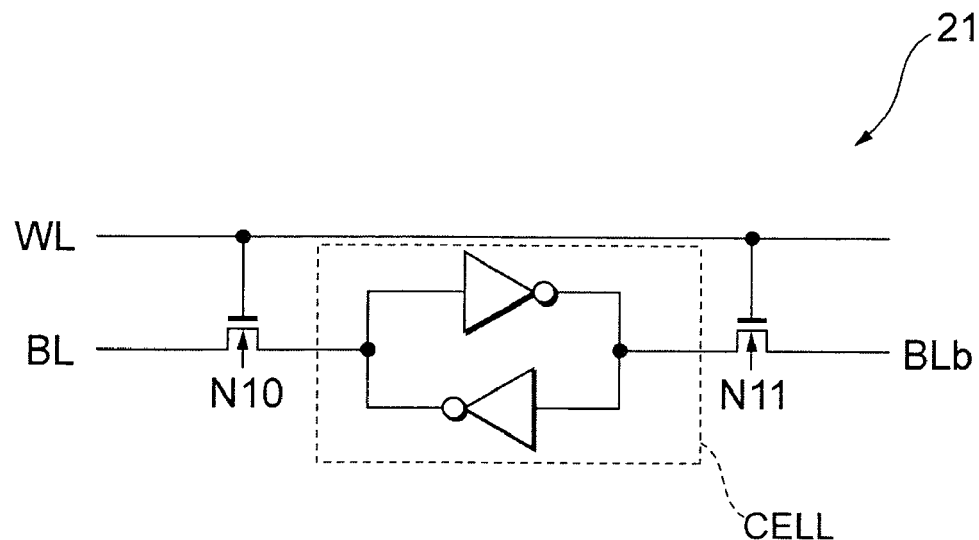
FIG. 8 is a circuit diagram of a memory cell.

The memory cell group A comprises memory cells arranged connected via bit line pairs (BLM0, BLM0b and BL0, BL0b) as in the embodiment 1; an output section 100 latching bit information read out via the other bit line pairs to output it; the cutoff circuit 112 that cuts the bit line pair off based on the WS; and an input section 111 instead of the transfer section 90 of the embodiment 1. A memory cell 21 of the embodiment 2 has an NMOS (hereinafter, called N10) for cutting off the BL connected to one side of the cell made up of two inverters as shown in FIG. 8 and an NMOS (hereinafter, called N11) for cutting off the BLb connected to the other side of the cell, which are both controlled by only the WL signal, and is a well-known memory cell.

The cutoff circuit 112 comprises an NMOS (hereinafter, called N5) for cutting off the BLb based on the WS and an NMOS (hereinafter, called N6) for cutting off the BL based on the WS.

Figure 7:
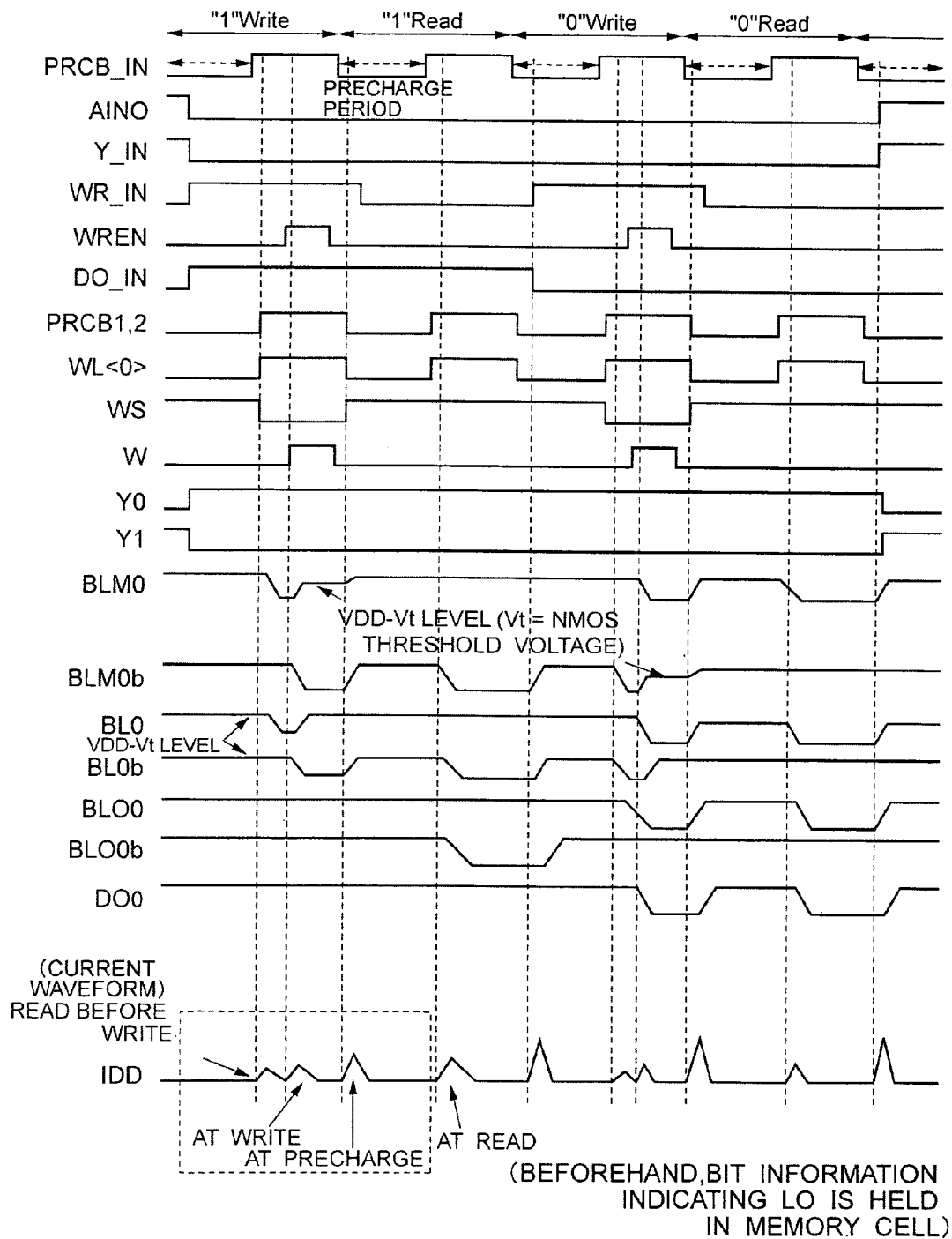
FIG. 7 is a timing chart for the embodiment 2.

In FIG. 7, the bit line BL on the output section 100 side cut off by the cutoff circuit 112 is indicated by BLO0, and the bit line BLb on the output section 100 side is indicated by BLO0b.

The cutoff circuit 112 is controlled by the WS to cut off the BL and BLb connected with the output section 100 in synchronism with the pre-charge period but only while writing into memory cells. Thus, the output section can be prevented from latching information on the BL and BLb during the write period.

An input section 111 comprises a first inverter receiving and inverting the D0, the inverter's output dividing into two, one of which is connected via an NMOS (hereinafter, called N8) to the BLb (BLb0 in FIG. 6); and a second inverter receiving and inverting the other, that is, the inverted signal to output the D0, the inverter's output dividing into two, one of which is connected via an NMOS (hereinafter, called N7) to the BL (BL0 in FIG. 6) and the other of which is connected via an NMOS (hereinafter, called N9) to the BL (BLO0 in FIG. 6).

The N7, N8, and N9 are controlled by the W. That is, when the W is in an enabling state, the cutoff of the N7, N8, and N9 is released, so that bit information to be written into a memory cell is supplied to the bit line pairs.

In the semiconductor integrated device provided with the memory array section 110 having this configuration, the operation of reading out the written bit information after writing a high potential as bit information into the memory cell 21 holding a low potential as bit information will be described with reference to FIG. 6.

Before writing bit information indicating the high potential, the bit lines are pre-charged as in the embodiment 1. After, that, the WL gets into an enabling state, so that bit information held in the memory cell 21 before writing is transmitted to the bit line pair.

However, the cutoff section 112 cuts off the bit line pair based on the WS signal in the unenabling state, and thus the output section 100 has no input signal, and thus does not operate to latch. Therefore, the cutoff section 112 controls the output section 100 not to operate needlessly, thereby reducing IDD.

After that, the W gets into the enabling state, bit information is supplied to the bit line pair, and the bit information indicating the high potential is held in the memory cell 21. Also at this time, the cutoff section 112 cuts off the bit line pair based on the WS signal in the unenabling state, and thus the output section 100 does not operate needlessly, thereby reducing IDD.

After the bit information indicating the high potential is written into the memory cell 21 and before reading out the bit information, the PRCB1 and PRCB2 get into an unenabling state so that the pre-charge is performed. At this time, the N7, N8, and N9 of the input section 111 become OFF in the control of the W signal in an unenabling state. Thus, the inside of the input section 111 is not pre-charged, and thereby the increase of IDD due to the pre-charge can be suppressed.

After the pre-charge, the WL gets into the enabling state, so that the bit information held in the memory cell 21 is read out via the output section 100 as in the embodiment 1.

According to the semiconductor integrated device of the embodiment 2, by providing the cutoff section 112 preventing the output section 100 from operating needlessly, a signal is supplied to the output section 100 only during the write period for memory cells. Thus, the output section 100 does not operate needlessly, thereby reducing IDD.

Embodiment 3

A semiconductor integrated device provided with an equalizer 113 cutting a bit line pair off from a potential supply port for pre-charge and equalizing potentials held in the bit line pair will be described.

Figure 10:
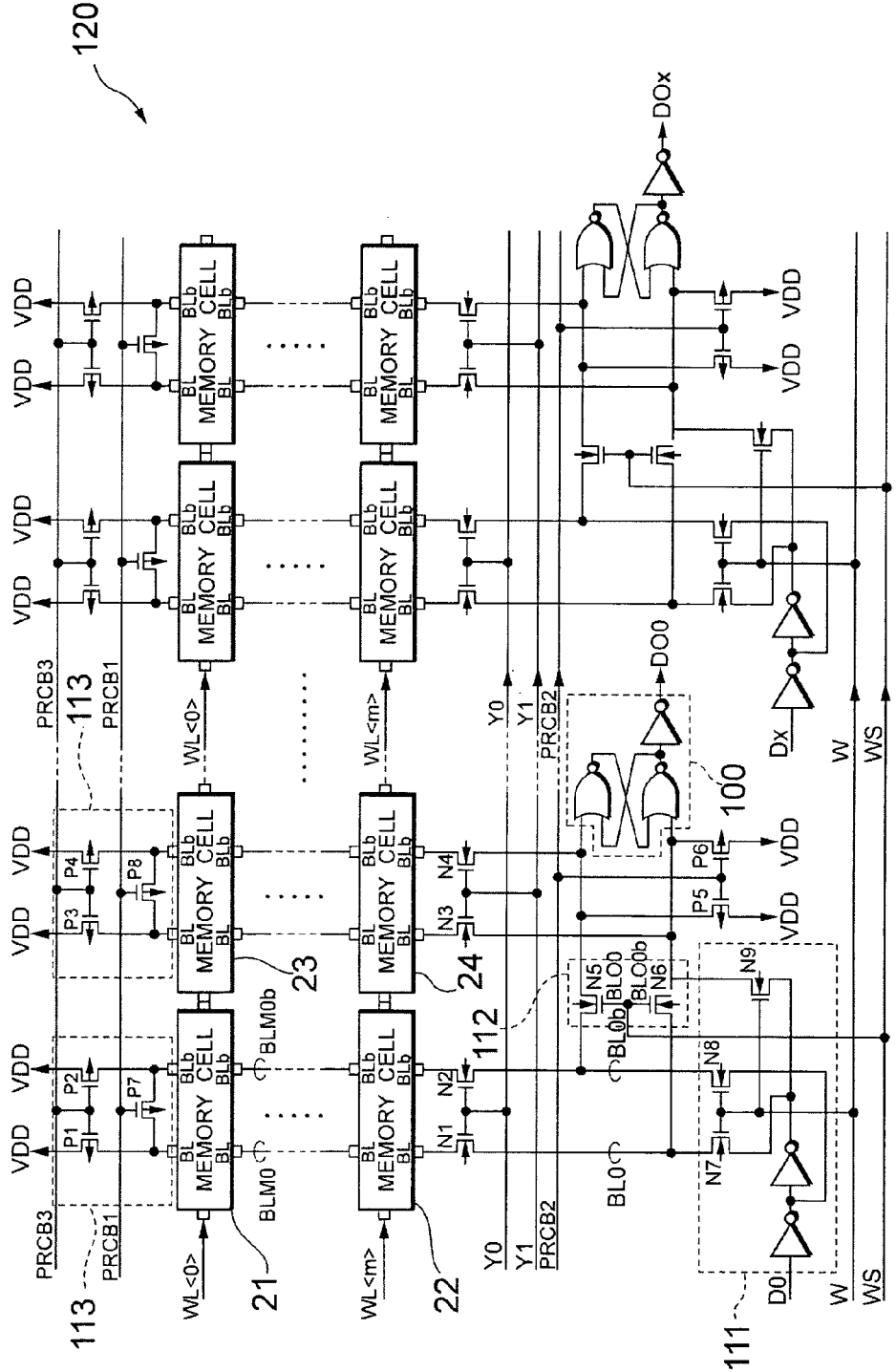
FIG. 10 is a circuit diagram showing a memory array section of embodiment 3.

As shown in FIG. 10, the memory array section 120 of embodiment 3 is, in configuration, the memory array section 110 of embodiment 1 provided with the equalizer 113, which operates based on a third pre-charge control signal for controlling pre-charge (hereinafter, simply called PRCB3).

The equalizer 113 comprises a first PMOS (hereinafter, called P1) that cuts off VDD for pre-charging the BL based on the PRCB3; a second PMOS (hereinafter, called P2) that cuts off VDD for pre-charging the BLb; and a PMOS (hereinafter, called P7) that cuts off the electrical connection between the BL and the BLb based on the PRCB1.

The equalizer 113 releases the cutoff to supply VDD to the BL and BLb when the PRCB3 is in an unenabling state, and stops supplying VDD when the PRCB3 gets into an enabling state. At this time, potentials due to the pre-charge are held in the bit line pair (PL and BLb) and in between the bit line pair and the the memory cell 21. The potentials held in the bit line pair are equalized by the P7 releasing the cutoff between the BL and BLb, the P7 operating based on the PRCB1 in the unenabling state.

Figure 11:
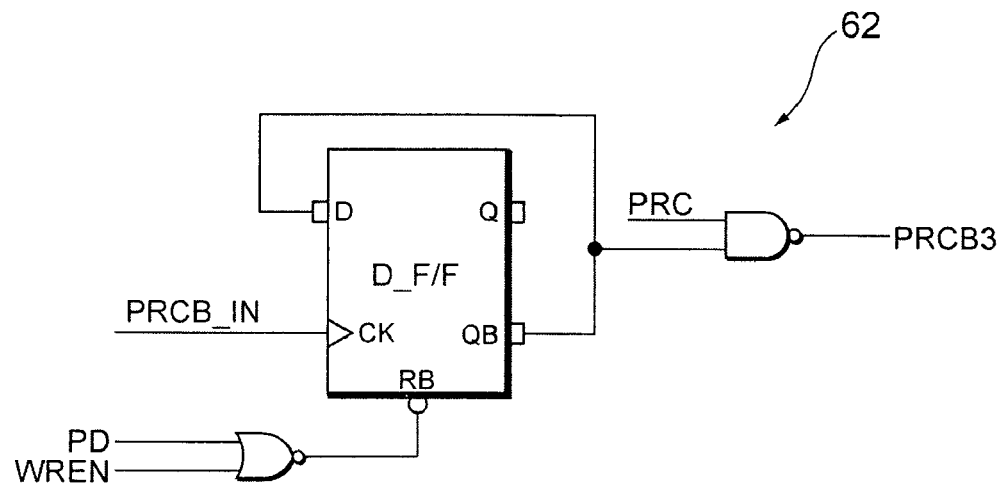
FIG. 11 is a circuit diagram showing a PRCB3 generator.

A PRCB3 generator 62 generating the PRCB3, as shown in FIG. 11, comprises a D flip-flop receiving PRCB_IN as a clock and having an inversion reset input port (hereinafter, called RB); a NOR circuit supplying a signal to the RB; and a NAND circuit receiving a signal generated by the D flip-flop.

The NOR circuit receives a signal (hereinafter, called PD) indicating that the power supply for the semiconductor integrated device is down when in an enabling state, and WREN to output the operation result.

The NAND circuit receives a signal opposite in phase to the PRCB_IN (hereinafter, called PRC) and the output from an inversion output port (hereinafter, called QB) of the D flip-flop to output the operation result as the PRCB3 in FIG. 12. By this means, in consecutive read cycles, the PRCB3 is in the unenabling state during the pre-charge period preceding the first read-out, and is in the enabling state during the first read-out period. Then, the PRCB3 remains in the enabling state during the pre-charge period preceding the second read-out, and gets into the unenabling state at the end of the second read-out period.

Figure 12A:
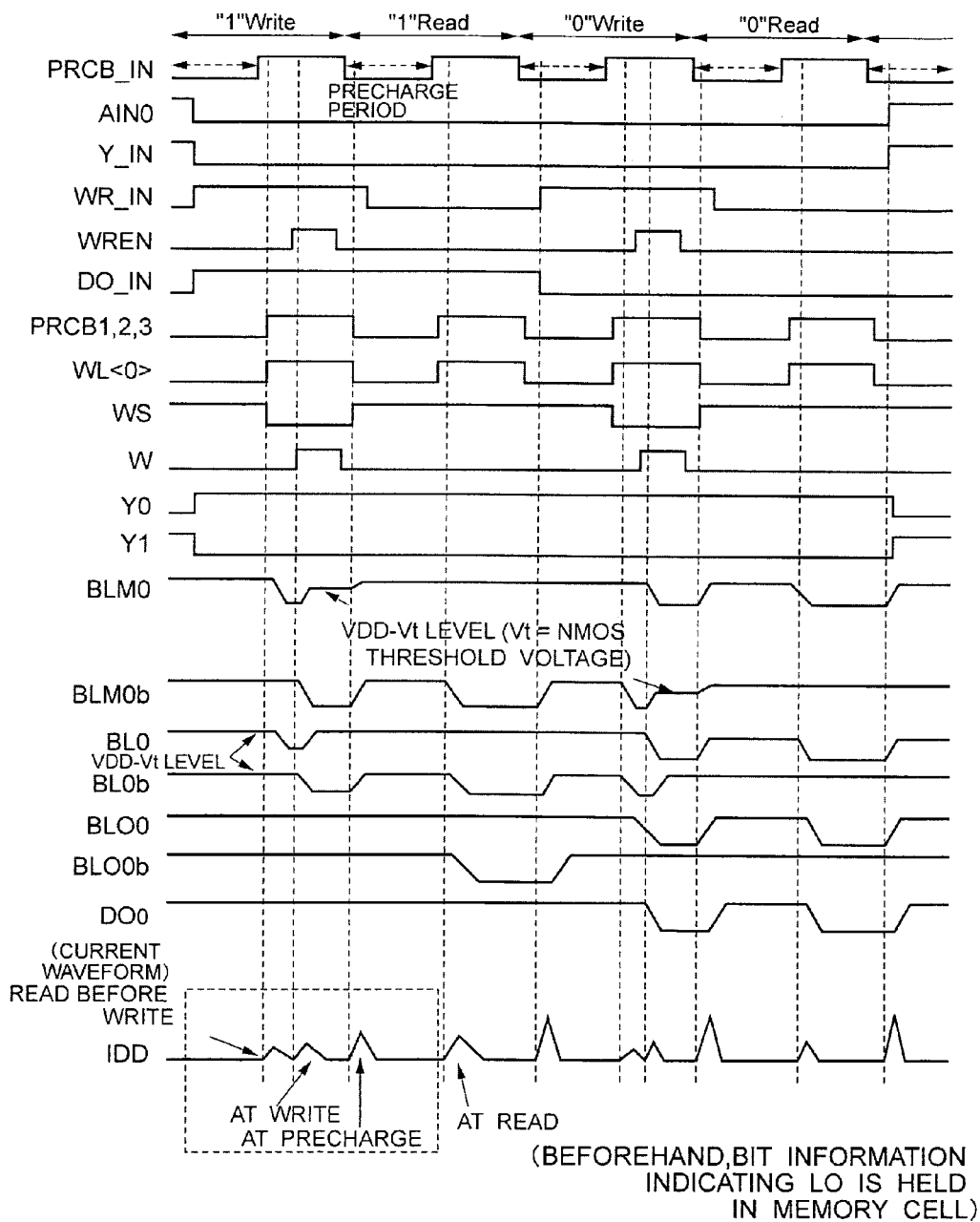
FIG. 12 including FIG. 12(a) and FIG. 12(b) is a timing chart for the embodiment 3.

FIG. 12(a) is a timing chart where bit information indicating the high potential is written into a memory cell holding bit information indicating the low potential, and the bit information is read out, and then bit information indicating the low potential is written into the memory cell, and the bit information is read out. Here, the PRCB3 is the same in cycle as the PRCB1 and PRCB2.

Figure 12B:
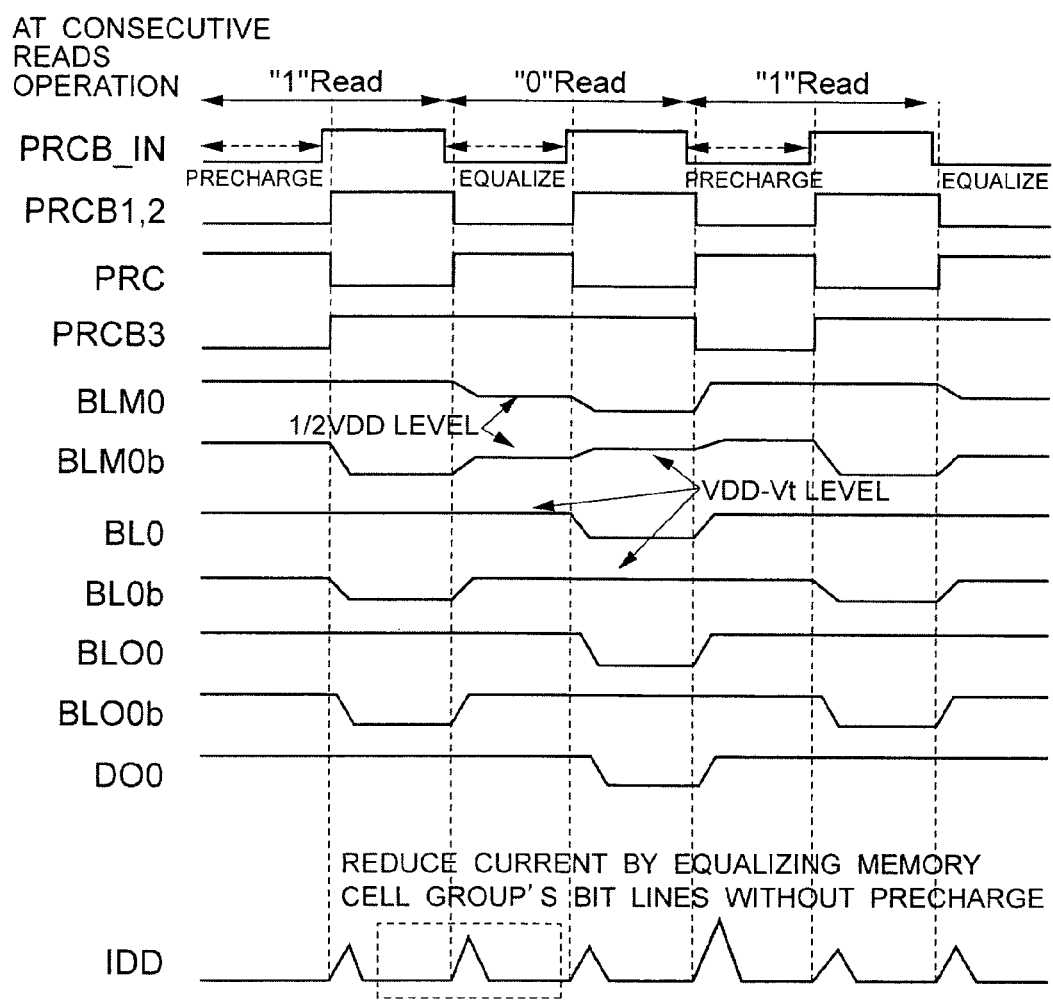
Figure 13:
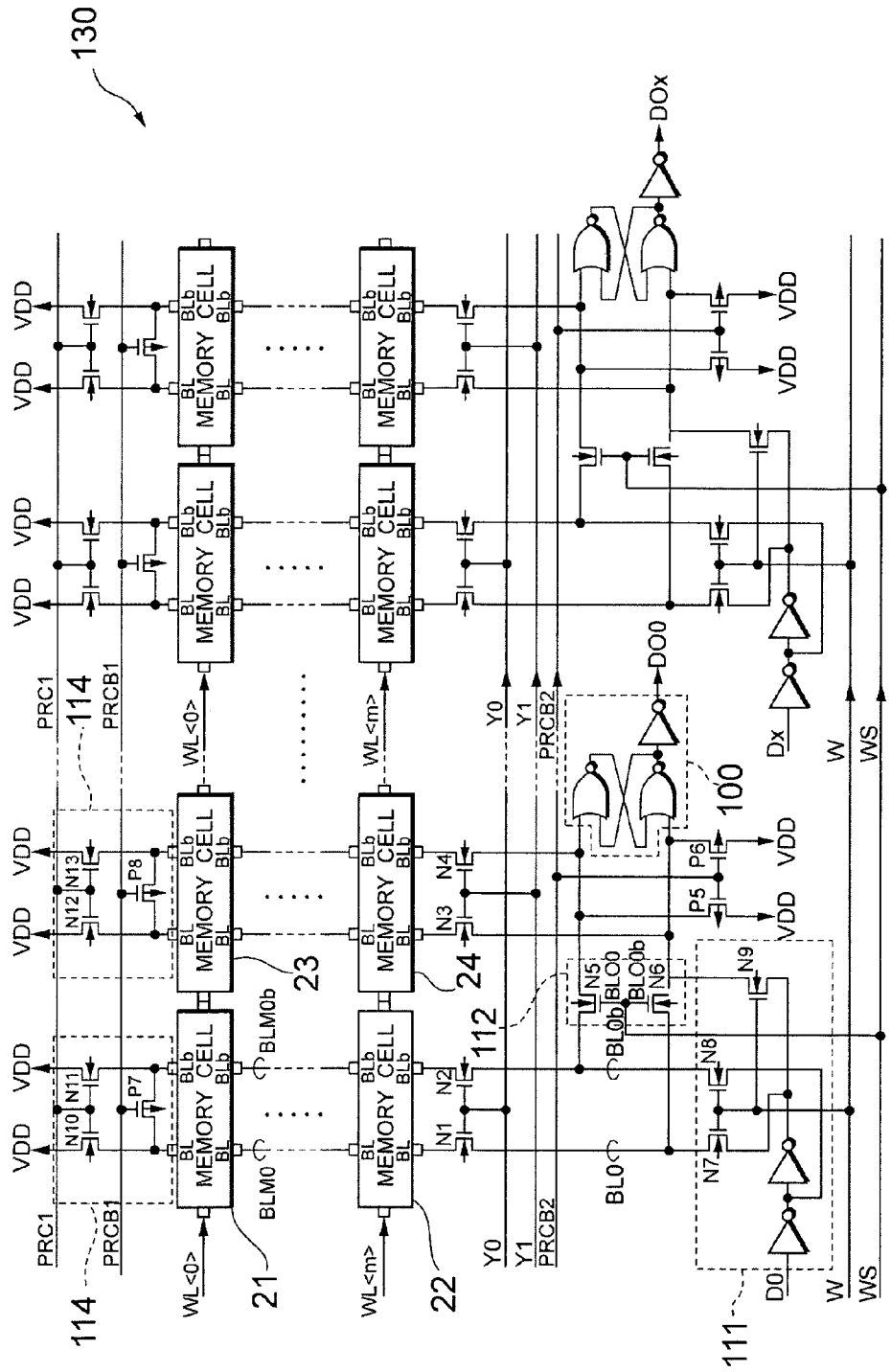
FIG. 13 is a circuit diagram showing a memory array section of embodiment 4.

In contrast, FIG. 12(b) is a timing chart where in FIG. 10, bit information indicating the high potential is read out from the memory cell 21, and bit information indicating the low potential is read out from the memory cell 23, and then the bit information indicating the high potential is read out from the memory cell 21, that is, a timing chart of consecutive readouts. Different from the PRCB1 and PRCB2, which are in the unenabling state during the pre-charge period and in the enabling state during the read period, the PRCB3 is in the enabling state during the second pre-charge period of three consecutive readouts. Herein, this enabling period is called an equalizing period, and the operation of the semiconductor integrated device during the equalizing period will be mainly explained.

With the semiconductor integrated device provided with the memory array section 120, the operation of reading out the bit information after writing bit information, shown in FIG. 12(a), is the same as in the embodiment 2, hence omitting a description thereof. The operation of three consecutive readouts, shown in FIG. 12(b), will be explained.

In the operation of reading bit information out from memory cells, while the PRCB1, PRCB2, and PRCB3 are in the unenabling state, the pre-charge is performed as in the previous embodiments, and then bit information held in a memory cell is output via the bit line pair to the output section 100. The output section 100 having latched the bit information outputs the read-out bit information.

While the PRCB3 is held in the enabling state, the next bit information is read out. The P1 and P2 of the equalizer 113 operating based on the PRCB3 continue to cut off the supply of VDD. By this means, in reading out bit information, the potential (bit information) supplied from the memory cell is held in the BL (represented as BLM0 in FIG. 12(b)). At this time, the PRCB1 is in the unenabling state, the P7 of the equalizer 113 operating based on the signal releases the cutoff between the BL and BLb (represented as BLM0b in FIG. 12(b)). By this means, the potential held in the BL is shared with the BLb, and the potentials of the BL and BLb are equalized.

The equalized potential is about half of VDD for the pre-charge. With this potential of ½ VDD as pre-charge voltage, bit information is read out from the memory cell. Because bit information is read out with the level of ½ VDD as pre-charge voltage obtained by the equalizer 113 equalizing without raising the pre-charge potential to the VDD level, the amount of consumption current can be reduced.

According to the semiconductor integrated device of the embodiment 3, the equalizer 113 is provided so that during one in two consecutive readouts, the potentials of the BL and BLb are equalized during the pre-charge period to read out bit information with this potential as pre-charge. Thus, consumption current can be reduced.

Embodiment 4

A semiconductor integrated device which comprises a memory array section 130 provided with an equalizer 114 having NMOSs cutting off a bit line pair instead of the PMOSs, which cut the bit line pair off from the pre-charge potential supply port in the equalizer 113 of the embodiment 3, will be described.

The memory array section 130 of the embodiment 4 is provided with the equalizer 114 that comprises an NMOS (hereinafter, called N10) cutting the BL off from the pre-charge potential supply port based on a control signal controlling the pre-charge (hereinafter, simply called PRC1); an NMOS (hereinafter, called N11) cutting the BLb off from the pre-charge potential supply port; and a PMOS P7 cuting off between the BL and the BLb in the control of the PRCB1.

Figure 14:
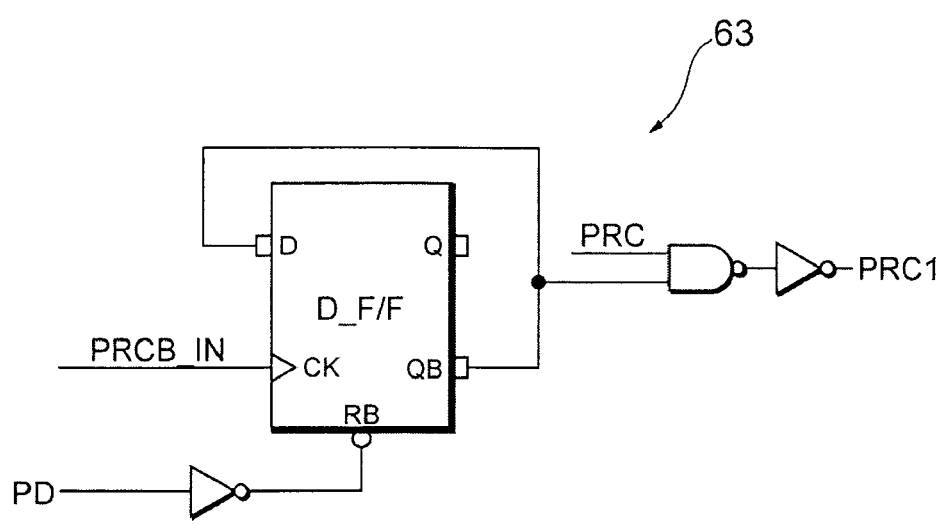
FIG. 14 is a circuit diagram showing a PRC1 generator.

The PRC1 controlling the N10 and N11 is generated by a PRC1 generator 63 shown in FIG. 14.

Figure 15:
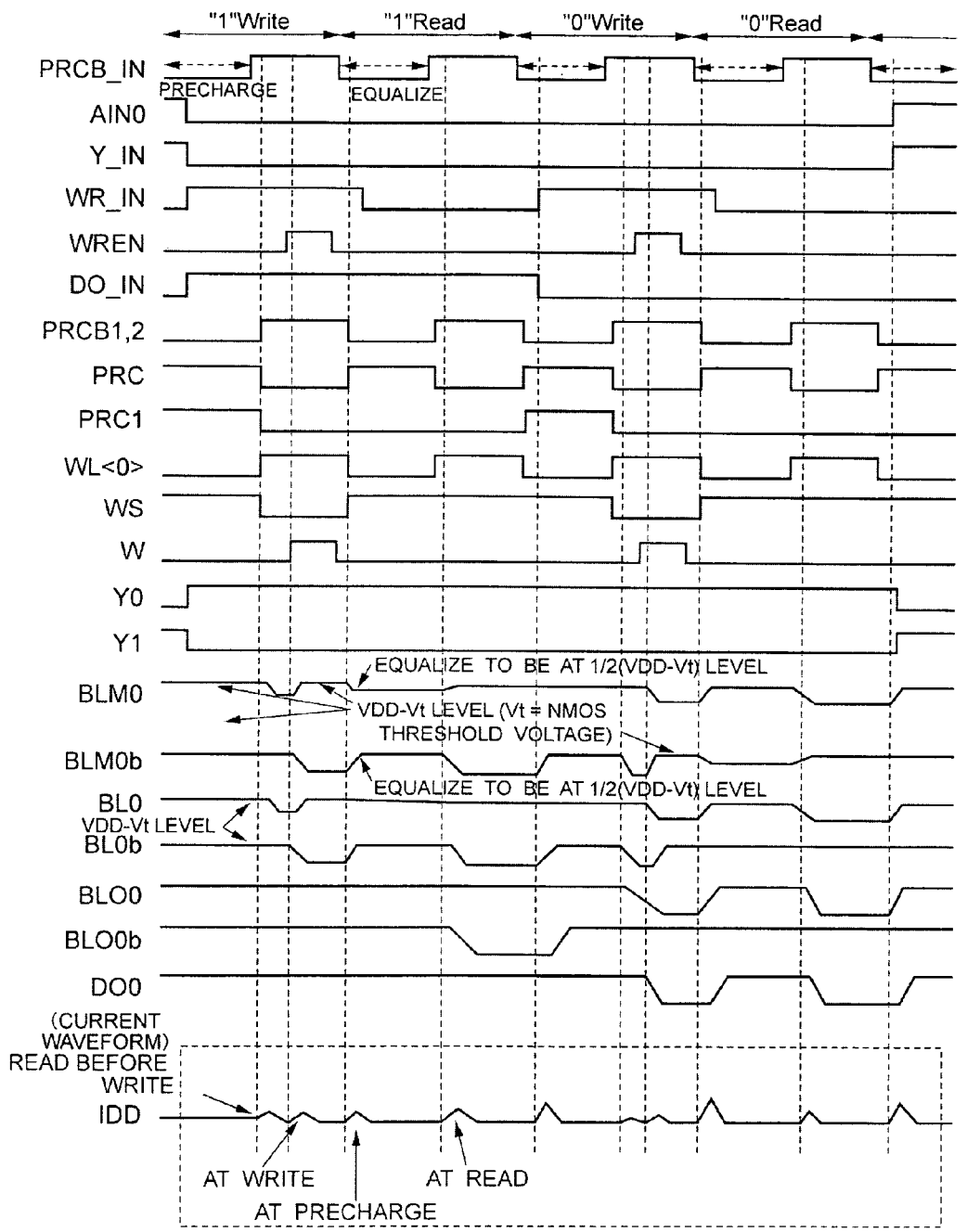
FIG. 15 is a timing chart for the embodiment 4.

The PRC1 generator 63, as shown in FIG. 14, comprises a D flip-flop receiving PRCB_IN as a clock and having a RB port; an inverter for outputting the inversion signal of PD to the RB; a NAND circuit receiving a signal generated by the D flip-flop and the PRC; and an inverter inverting a signal output from the NAND circuit to output it. The PRC1 generator 63, as shown in FIG. 15, generates the PRC1 that is in an enabling state only during the pre-charge period of the former access cycle in two cycles of access to a memory cell and then continues to be in an unenabling state.

Next, the operation of the memory array section 130 provided with the equalizer 114 will be explained. FIG. 15 is a timing chart where bit information indicating a high potential is written into a memory cell holding bit information indicating a low potential, and the bit information is read out, and then bit information indicating the low potential is written into the memory cell, and the bit information is read out.

In order to pre-charge before writing, the N10 of the equalizer 114 releases the cutoff between the BL and the pre-charge potential supply port based on the PRC1 in the enabling state, and the N11 of the equalizer 114 releases the cutoff between the BLb and the pre-charge potential supply port based on the PRC1.

At this time, the PRCB1 is in the unenabling state, and thereby the P7 of the equalizer 114 releases the cutoff between the BL and BLb. After that, the PRCB1 gets into the enabling state to cut off between the BL and BLb. Then the PRC1 gets into the unenabling state to cut the BL and BLb from the pre-charge potential supply ports, and bit information indicating the high potential is written into the memory cell 21. At this time, the cutoff section 112 operating based on the WS cuts off the supply from the bit line pair to the output section 100, and thus the output section 100 can be stopped from operating, thereby reducing the amount of consumption current.

After that, in order to pre-charge for reading out bit information, the PRCB1 gets into the unenabling state to release the cutoff between the BL and BLb. At this time, the PRC1 is held in the unenabling state, and thus the BL and BLb are kept cut off from the pre-charge potential supply ports. By this means, a potential of VDD-vt, where vt is the threshold voltage of NMOS, applied to the BL (represented as BLM0 in FIG. 15) is shared between the BL and BLb (represented as BLM0b in FIG. 15). By this means, the potentials of the BL and BLb are equalized to be at a level of ½ (VDD-vt), and then the bit information is read out with the potential as pre-charge. Hence, the bit information can be read out without raising the pre-charge potential to the VDD level and thus with low consumption current.

After reading out bit information indicating the high potential, bit information indicating the low potential is written, and also when reading out the bit information, the same equalization as above is performed. Thus, writing and reading is performed with low consumption current.

Therefore, according to the semiconductor integrated device of the embodiment 4, the pre-charge and equalizing are alternatively repeated by the equalizer 114 operating based on the PRC1 and PRCB1, and thereby the amount of consumption current can be reduced.

Moreover, according to the semiconductor integrated device of the embodiment 4, by using NMOSs in the configuration of the equalizer 114, the area required for integration thereof can be reduced compared with PMOSs, and thus the package size of the semiconductor integrated device can be made smaller.

As described above, according to the semiconductor integrated device of the present invention, by providing the cutoff circuit for cutting off the output to the bit lines when reading out bit information, the number of times of charging and discharging the bit lines can be reduced, and thereby consumption current can be reduced.

As described above, according to the semiconductor integrated device of the present invention, by providing the cutoff section for the bit lines connected to the output section outputting bit information, the supply of a signal to the output section is cut off except when reading out. Thus, the output section can be prevented from operating needlessly, and thereby consumption current can be reduced.

Moreover, according to the semiconductor integrated device of the present invention, the equalizer equalizes the potentials held by cutting off the pre-charged bit lines, and with the equalized potential, a memory cell is accessed. Thus, it can be avoided to pre-charge to the high potential, and thereby consumption current can be reduced.

Hence, the bit information can be read out without raising the pre-charge potential to the VDD level, and with low consumption current.

Although the preferred embodiment of the present invention has been described in detail, it should be understood that various changes, substitutions and alterations can be made therein without departing from the spirit and scope of the invention as defined by the appended claims.

What is claimed is:

1. A semiconductor integrated device comprising:
   a first bit line;
   a second bit line;
   a first word line;
   a second word line;
   a memory cell group having a first memory cell and a second memory cell, wherein each memory cell is connected to the first and second bit lines and the first and second word lines,
   wherein each of the memory cells comprise
      a first inverter having a first input node and a first output node,
      a second inverter having a second input node and a second output node, wherein the first input node of the first inverter is connected to the second output node of the second inverter, and the first output node of the first inverter is connected to the second input node of the second inverter, a first switch connected to the first input node of the first inverter, the first bit line and the first word line, wherein the first switch electrically connects the first input node to the first bit line during a first operation, and a second switch connected to the second input node of the second inverter, the second bit line and the second word line, wherein the second switch electrically connects the second input node and the second bit line during the first operation and during a second operation; and an output circuit connected to the first and second bit lines, wherein the output circuit outputs a bit information when a signal from either of the bit lines is latched.

2. The semiconductor integrated device according to claim 1, wherein the first operation is a write operation and the second operation is a read operation.

3. The semiconductor integrated device according to claim 1, wherein the first switch is a transistor having a gate connected to the first word line, a first source/drain terminal connected to the first bit line, and a second source/drain terminal connected to the first input node of the first inverter, and wherein the second switch is a transistor having a gate connected to the second word line, a first source/drain terminal connected to the second bit line, and a second source/drain terminal connected to the second input node of the second inverter.

4. The semiconductor integrated device according to claim 3, wherein the first operation is a write operation and the second operation is a read operation.

5. The semiconductor integrated device according to claim 1, wherein the output circuit comprises:

a first NOR circuit having a first input terminal which is connected to the first bit line, a second input terminal and a first output terminal;

a second NOR circuit having a third input terminal which is connected to the second bit line, a fourth input terminal which is connected to the first output terminal of the first NOR circuit, and a second output terminal which is connected to the second input terminal of the first NOR circuit; and an inverter connected to the second output terminal of the second NOR circuit.

* * * * *